US012695987B2

(12) United States Patent
Choi et al.

(10) Patent No.: US 12,695,987 B2
(45) Date of Patent: Jul. 28, 2026

(54) APPARATUS AND METHOD FOR CONTROLLING CAMERA MODULE

(71) Applicant: LX Semicon Co., Ltd, Daejeon (KR)

(72) Inventors: Seung Jun Choi, Daejeon (KR); Kyu Ho Kim, Daejeon (KR); Tae Gwan Kim, Daejeon (KR); Su Gyeong Park, Daejeon (KR)

(73) Assignee: LX SEMICON CO., LTD, Daejeon (KR)

( * ) Notice: Subject to any disclaimer, the term of this patent is extended or adjusted under 35 U.S.C. 154(b) by 1044 days.

(21) Appl. No.: 17/831,023

(22) Filed: Jun. 2, 2022

(65) Prior Publication Data

US 2023/0179861 A1 Jun. 8, 2023

(30) Foreign Application Priority Data

Dec. 7, 2021 (KR) ........................ 10-2021-0173435

(51) Int. Cl.
*H04N 23/68* (2023.01)
*G06F 30/373* (2020.01)
*G06F 30/38* (2020.01)

(52) U.S. Cl.
CPC ....... *H04N 23/6812* (2023.01); *G06F 30/373* (2020.01); *G06F 30/38* (2020.01)

(58) Field of Classification Search
None
See application file for complete search history.

(56) References Cited

U.S. PATENT DOCUMENTS

| | | | |
|---|---|---|---|
| 5,971,579 A * | 10/1999 | Kim | G05B 13/0265 |
| | | | 700/41 |
| 6,950,712 B2 | 9/2005 | Ulyanov et al. | |
| 9,082,079 B1 * | 7/2015 | Coenen | G06N 3/0495 |
| 9,886,008 B1 * | 2/2018 | Gahinet | G05B 13/021 |
| 10,197,763 B2 | 2/2019 | Cheong et al. | |
| 11,039,071 B2 * | 6/2021 | Min | H04N 23/57 |
| 2003/0098962 A1 * | 5/2003 | Kubo | G03F 7/70716 |
| | | | 355/75 |
| 2004/0153173 A1 * | 8/2004 | Chang | G05B 13/024 |
| | | | 700/28 |

(Continued)

FOREIGN PATENT DOCUMENTS

| | | |
|---|---|---|
| KR | 10-0890526 B1 | 3/2009 |
| KR | 10-2016-0139523 A | 12/2016 |
| KR | 10-2020-0112003 A | 10/2020 |

OTHER PUBLICATIONS

Korean Office Action dated May 4, 2026 issued in Patent Application No. KR 10-2021-0173435 (8 pages).

Primary Examiner — James M Hannett
(74) Attorney, Agent, or Firm — POLSINELLI PC

(57) ABSTRACT

An embodiment discloses an apparatus for controlling a camera module, including a parameter generation unit configured to generate a parameter entity group, calculate a fitness value of the parameter entity group based on a step response characteristic of an output signal, and generate an offspring entity by applying weight-gain elitism to a parameter entity having the smallest fitness value among parameter entities included in the parameter entity group, and a controller configured to generate a control signal by multiplying an error signal by a parameter.

16 Claims, 8 Drawing Sheets

(56)     References Cited

U.S. PATENT DOCUMENTS

2008/0152332 A1*   6/2008   Koo .................. H04N 23/6812
                                                                348/E5.046
2015/0181122 A1*   6/2015   Kang .................. H04N 23/687
                                                                348/208.1
2016/0248977 A1*   8/2016   Kitano .............. H04N 23/6812
2019/0228505 A1*   7/2019   Douady-Pleven ..... H04N 23/63
2020/0327648 A1*   10/2020  Lin ........................ G06V 10/30
2022/0146852 A1*   5/2022   Yu ........................ G02B 27/644

* cited by examiner

1

APPARATUS AND METHOD FOR CONTROLLING CAMERA MODULE

BACKGROUND

1. Technical Field

Embodiments relate to an apparatus and method for controlling a camera module, and more particularly, an apparatus and method for controlling a camera module, which include an image stabilization function.

2. Related Art

In general, a camera module embedded in a mobile phone has been generalized by being touted as its immediacy. As image communication is made possible with the development of the mobile communication technology, the camera module has become an essential element. Such a camera module applied to a mobile phone may be a fixed focus (F.F) type, an auto focus (A.F) type, an optical image stabilization (OIS) type, etc.

A conventional camera module has been equipped with a coil pattern, etc. disposed on a circuit board in order to implement an image stabilization function. Furthermore, the conventional camera module finds a parameter for proportional integral differential (PID) control of an actuator of the camera module, which satisfies a desired response characteristic.

However, the conventional OIS camera module has a problem in that it takes a long modeling time to find the PID parameter fully satisfying a desired response characteristic.

Furthermore, the conventional OIS camera module uses a given algorithm to find the PID parameter satisfying a desired response characteristic, but has problems in that the algorithm has low processing speed and may not find an optimal solution.

SUMMARY

Various embodiments are directed to rapidly obtaining a PID parameter of a camera module.

Furthermore, embodiments are directed to precisely controlling image stabilization correction by changing an optimal gain factor of a camera module.

Objects to be achieved by embodiments are not limited to the aforementioned objects, and the other objects not described above may be evidently understood from the following description of embodiments by a person having ordinary knowledge in the art.

An embodiment provides an apparatus for controlling a camera module. The apparatus for controlling a camera module may include a parameter generation unit configured to generate a parameter entity group, calculate a fitness value of the parameter entity group based on a step response characteristic of an output signal, and generate an offspring entity by applying weight-gain elitism to a parameter entity having the smallest fitness value among parameter entities included in the parameter entity group, and a controller configured to generate a control signal by multiplying an error signal by a parameter. The error signal is a difference between the output signal and a reference signal. The weight-gain elitism is a genetic algorithm operation of adding a weight according to the step response characteristic to a parameter having the smallest fitness value.

Accordingly, the apparatus for controlling a camera module according to an embodiment has an effect in that it can rapidly generate a plurality of PID child parameter entities of a next generation by applying the weight-gain elitism to a plurality of PID parameter entities of a current generation so that a target fitness value is rapidly reached.

Furthermore, the apparatus for controlling a camera module according to an embodiment has an effect in that it can rapidly generate a plurality of PID child parameter entities of a next generation by applying the weight-gain elitism to a plurality of PID parameter entities of a current generation so that a target fitness value having the smallest error is reached.

Furthermore, an embodiment provides a method of controlling a camera module. The method of controlling a camera module may include generating an output signal in response to a control signal, generating an error signal corresponding to a difference between the output signal and a reference signal, generating a parameter entity group, calculating a fitness value of the parameter entity group based on a step response characteristic of the output signal, generating an offspring entity by applying weight-gain elitism to a parameter entity having the smallest fitness value among parameter entities included in the parameter entity group, and generating the control signal by multiplying the error signal by the parameter. The weight-gain elitism is a genetic algorithm operation of adding a weight according to the step response characteristic to a parameter having the smallest fitness value.

Accordingly, the method of controlling a camera module according to an embodiment has an effect in that it can rapidly generate a plurality of PID child parameter entities of a next generation by applying the weight-gain elitism to a plurality of PID parameter entities of a current generation so that a target fitness value is rapidly reached.

Furthermore, the method of controlling a camera module according to an embodiment has an effect in that it can rapidly generate a plurality of PID child parameter entities of a next generation by applying the weight-gain elitism to a plurality of PID parameter entities of a current generation so that a target fitness value having the smallest error is reached.

The apparatus for controlling a camera module and the method of controlling a camera module according to embodiments are intended to rapidly obtain PID parameters that control a camera module without the modeling of an OIS system.

Furthermore, an embodiment has an effect in that it can precisely control OIS by changing PID parameters of a camera module.

DETAILED DESCRIPTION

Hereinafter, an apparatus for controlling a camera module according to an embodiment is described with reference to FIG. 1.

Figure 1:
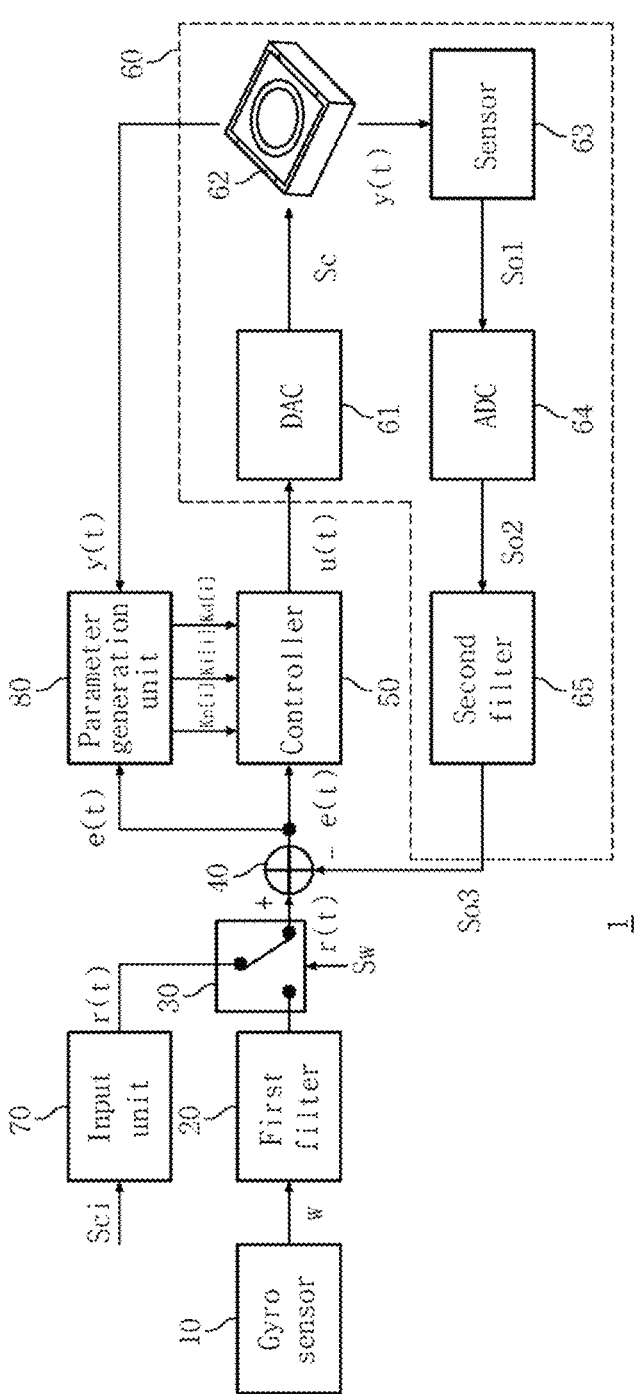
FIG. 1 is a block diagram illustrating a configuration of an apparatus for controlling a camera module according to an embodiment.

FIG. 1 is a block diagram illustrating a configuration of the apparatus for controlling a camera module according to an embodiment.

Referring to FIG. 1, the apparatus 1 for controlling a camera module may obtain proportional integral differential (PID) parameters applied to optical image stabilization (OIS), and can facilitate the image stabilization of a camera module by using the obtained PID parameters. The apparatus 1 for controlling a camera module includes a gyro sensor 10, a first filter 20, a switch 30, an error generator 40, a controller 50, a camera module unit 60, an input unit 70, and a parameter generation unit 80.

The gyro sensor 10 may detect a motion of the camera module unit 60. The gyro sensor 10 may generate an angular speed signal ω including a rotating angular speed corresponding to a motion of the camera module unit 60. For example, the gyro sensor 10 may detect a motion of the camera module unit 60, which occurs in response to the image stabilization of a user. The gyro sensor 10 may generate the angular speed signal ω in response to the image stabilization of a user. The gyro sensor 10 may be a two-axis gyro sensor or a three-axis gyro sensor, but an embodiment is not limited thereto, and the gyro sensor 10 may be an angular speed sensor.

The first filter 20 may remove noise from the angular speed signal ω and deliver the angular speed signal ω to the switch 30.

A switching operation of the switch 30 is controlled in response to a switching signal Sw. The switching of the switching signal Sw may be controlled so that the angular speed signal ω from which noise has been removed is delivered to the controller 50 as a reference signal r(t). The switching signal may be a control signal received from the outside of the apparatus 1 for controlling a camera module, if a user tries to tune a PID parameter of the apparatus 1 for controlling a camera module to an optimal PID parameter, but an embodiment is not limited thereto. The switch 30 may deliver the angular speed signal ω from which noise has been removed, as the reference signal r(t), to the controller 50 in response to the switching signal Sw. The switch 30 may deliver a step input signal from the input unit 70 to the controller 50 as the reference signal r(t) in response to the switching signal Sw.

The error generator 40 may generate an error signal e(t) based on a difference between the reference signal r(t) and an output signal So3 of the camera module unit 60.

The controller 50 may generate a control signal u(t) by performing proportional control, integral control, and derivative control on the error signal u(t). The controller 50 may generate an initial PID parameter entity group including an initial PID parameter and an optimal PID parameter entity group including an optimal PID parameter. The controller 50 may generate the control signal u(t) using the initial PID parameter entity group and the optimal PID parameter entity group. The controller 50 may generate the control signal u(t) using a difference value (hereinafter an "error") between the reference signal r(t) and the output signal So3. A detailed method of the controller 50 generating the control signal u(t) is described later.

The camera module unit 60 includes a digital-to-analog converter (DAC) 61, a camera module 62, a sensor 63, an analog-to-digital converter (ADC) 64, and a second filter 65, and may control the camera module 62 in response to the control signal u(t). The camera module unit 60 may generate the output signal So3 corresponding to a location of an actuator (not illustrated) included in the camera module 62. The actuator may drive a camera module lens (not illustrated) and/or an image sensor (not illustrated), included in the camera module 62, in a direction opposite to a direction in which a user's hand is shaken.

The DAC 61 may generate a control signal Sc by converting the control signal u(t) into an analog signal.

The camera module 62 may photograph a given subject. The camera module 62 may generate an output signal y(t) in response to the control signal Sc so that the image stabilization of a user is corrected. The actuator may control locations of the camera module lens (not illustrated) and/or the image sensor (not illustrated), included in the camera module 62, in response to the output signal y(t) so that image stabilization of a user is corrected. A description of a detailed method of the actuator controlling locations of the camera module lens and/or the image sensor is omitted.

The sensor 63 may detect a location of the actuator based on the output signal y(t). The sensor 63 may generate an output signal So1 including a location of the actuator. The sensor 63 may be a hall sensor for detecting a change in the magnetic field of a magnet, but an embodiment is not limited thereto.

The ADC 64 may generate an output signal So2 by converting the output signal So1 into a digital signal.

The second filter 65 may generate the output signal So3 by filtering out noise included in the output signal So2.

The input unit 70 may generate the reference signal r(t). The input unit 70 may generate the step input signal as the reference signal r(t) in response to an input control signal Sci, if a user tries to tune a PID parameter of the apparatus 1 for controlling a camera module to an optimal PID parameter. A description of a detailed method of the input unit 70 generating the reference signal r(t) is omitted.

The parameter generation unit 80 may generate an optimal PID parameter by using a genetic algorithm after generating an initial PID parameter. The parameter generation unit 80 may generate a proportional parameter Kp, an integral parameter Ki, and a derivative parameter Kd of a next generation by using the genetic algorithm. For example, the parameter generation unit 80 may generate initial parameters Kp[1], Ki[1], and Kd[1], and may represent the initial parameters as a bit string. The parameter generation unit 80 may generate parameters Kp[i−1], Ki[i−1], and Kd[i−1], and may represent the parameters as a bit string. The parameter generation unit 80 may generate optimal parameters of a next generation by using the reference signal r(t) as the step input signal r(t) with respect to the parameters Kp[i−1], Ki[i−1], and Kd[i−1]. That is, the parameter generation unit 80 may generate the parameters Kp[i], Ki[i], and Kd[i] of the next generation while increasing the value i for each unit. In this case, the parameter generation unit 80 may generate a parameter entity group of the next generation until the value i is identical with the size of the parameter entity group. The parameter generation unit 80 may use selection, crossover, or mutation as an operation of the genetic algorithm, but an embodiment is not limited thereto.

For example, the parameter generation unit 80 determines an entity of a next generation 개체를 선택함으로써 based on a fitness value corresponding to the entity included in the parameter (Kp[i], Ki[i], Kd[i])) entity group. The parameter generation unit 80 may leave, in a next generation, an entity having a lower fitness value among entities of a PID parameter entity group without any change. A selection operation performed by the parameter generation unit 80 may be elitism. Elitism according to an embodiment is an operation of selecting an entity that survives as it is in a next generation in inverse proportion to a fitness value. Furthermore, the parameter generation unit 80 may generate an entity of a next generation by applying weight-gain elitism that assigns a weight to a parameter of an entity having the smallest fitness value among entities of a parameter entity group including a PID parameter entity (hereinafter referred to as a "parameter entity").

The parameter generation unit 80 may select two parent parameter entities among a plurality of parameter entities. The parameter generation unit 80 may generate a new child parameter entity by performing a crossover operation of exchanging some of genes of the selected two parent parameter entities.

The parameter generation unit 80 may select one parent parameter entity among a plurality of parameter entities. The parameter generation unit 80 may generate a new child parameter entity by performing a mutation operation on a gene of the selected one parent parameter entity. The mutation operation may be an operation of forcedly converting some values of a gene of the parent parameter entity.

The parameter generation unit 80 may select at least one parent parameter entity among a plurality of parameter entities by using a roulette algorithm, but an embodiment is not limited thereto. The parameter generation unit 80 may apply any algorithm if the algorithm is an algorithm that stochastically selects an entity.

A method of the parameter generation unit 80 generating a child parameter entity of a next generation by applying the genetic algorithm after selecting at least one parent parameter entity is described later.

Hereinafter, a controller according to an embodiment is described with reference to FIG. 2.

Figure 2:
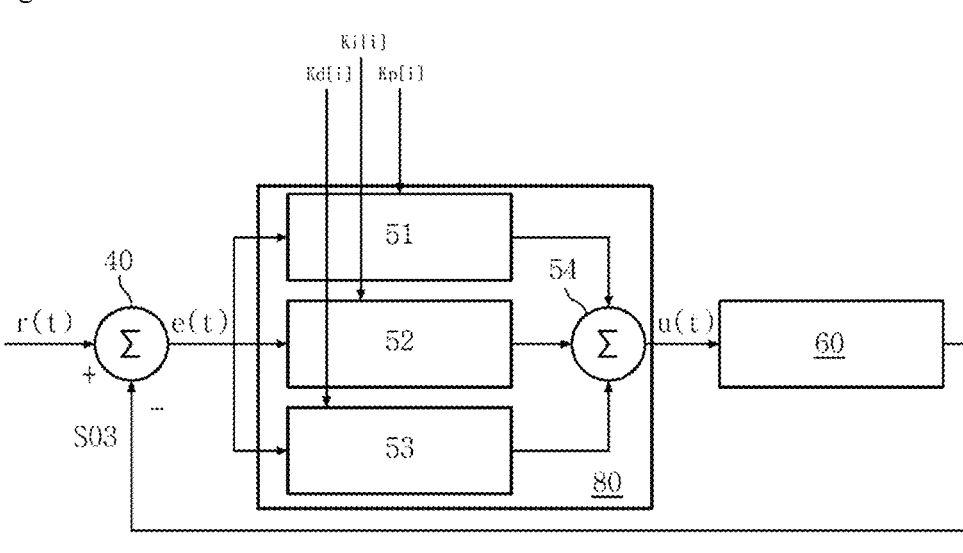
FIG. 2 is a block diagram illustrating a configuration of a controller according to an embodiment.

FIG. 2 is a block diagram illustrating a configuration of a controller according to an embodiment.

Referring to FIG. 2, the controller 50 according to an embodiment may include a first control output generator 51, a second control output generator 52, and a third control output generator 53, and may generate the control signal u(t) by performing proportional control, integral control, and derivative control on the error signal e(t).

The first control output generator 51 may generate a control signal by multiplying the error signal e(t) by a proportional parameter Kp. The first control output generator 51 may generate a control signal whose rising time is decreased and overshooting is increased as the proportional parameter Kp is increased.

The second control output generator 52 may generate a control signal by multiplying an integral value of the error signal e(t) by an integral parameter Ki. The second control output generator 52 may generate a control signal in response to a fine error signal e(t).

The third control output generator 53 may output a control signal by multiplying a derivative value of the error signal e(t) by an derivative parameter Kd. The third control output generator 53 may generate a control signal in response to a change in the error before a sudden change in the error occurs by generating the control signal when a change in the error is large.

Accordingly, the controller 50 can generate the control signal u(t) by adding proportional control, integral control, and derivative control and perform control before an error is increased, thereby increasing the stability of the apparatus for controlling a camera module.

The control signal u(t) may be generated using Equation 1 below.

$$u(t) = K_p e(t) + K_i \int_O^t e(t)dt + K_d \frac{de(t)}{dt} \qquad \text{[Equation 1]}$$

In Equation 1, Kp is the proportional parameter, Ki is the integral parameter, and Kd is the derivative parameter.

Hereinafter, a format of PID parameters generated by the parameter generation unit according to an embodiment is described with reference to FIG. 3.

Figure 3:
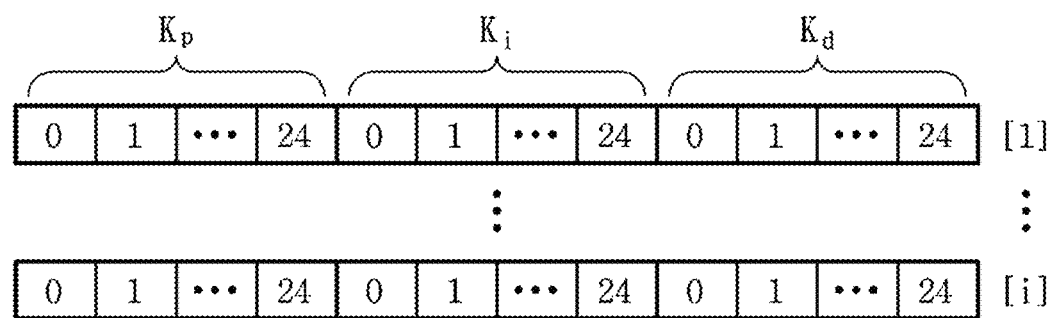
FIG. 3 illustrates that PID parameters according to an embodiment are represented as a bit string.

FIG. 3 illustrates that PID parameters according to an embodiment are represented as a bit string.

Referring to FIG. 3, the parameter generation unit 80 may calculate a proportional parameter Kp, an integral parameter Ki, and a derivative parameter Kd. The proportional parameter Kp, the integral parameter Ki, and the derivative parameter Kd may be represented as a bit string of 25 bits from 0 to 24, but an embodiment is not limited thereto. The parameter generation unit 80 may randomly generate an initial proportional parameter Kp[1], an initial integral parameter Ki[1], and an initial derivative parameter Kd[1]. Furthermore, the parameter generation unit 80 may use the genetic algorithm to generate an i-th optimal proportional parameter Kp[i], an i-th optimal integral parameter Ki[i], and an i-th optimal derivative parameter Kd[i]. In this case, i is an entity group size (or population size) of a generated offspring entity. PID parameters according to an embodiment are 25 bits, but the following description is made on the assumption that each PID parameter has 5 bits, for convenience sake.

Hereinafter, a method of the parameter generation unit 80 calculating a fitness value according to an embodiment is described in detail with reference to FIG. 4.

Figure 4:
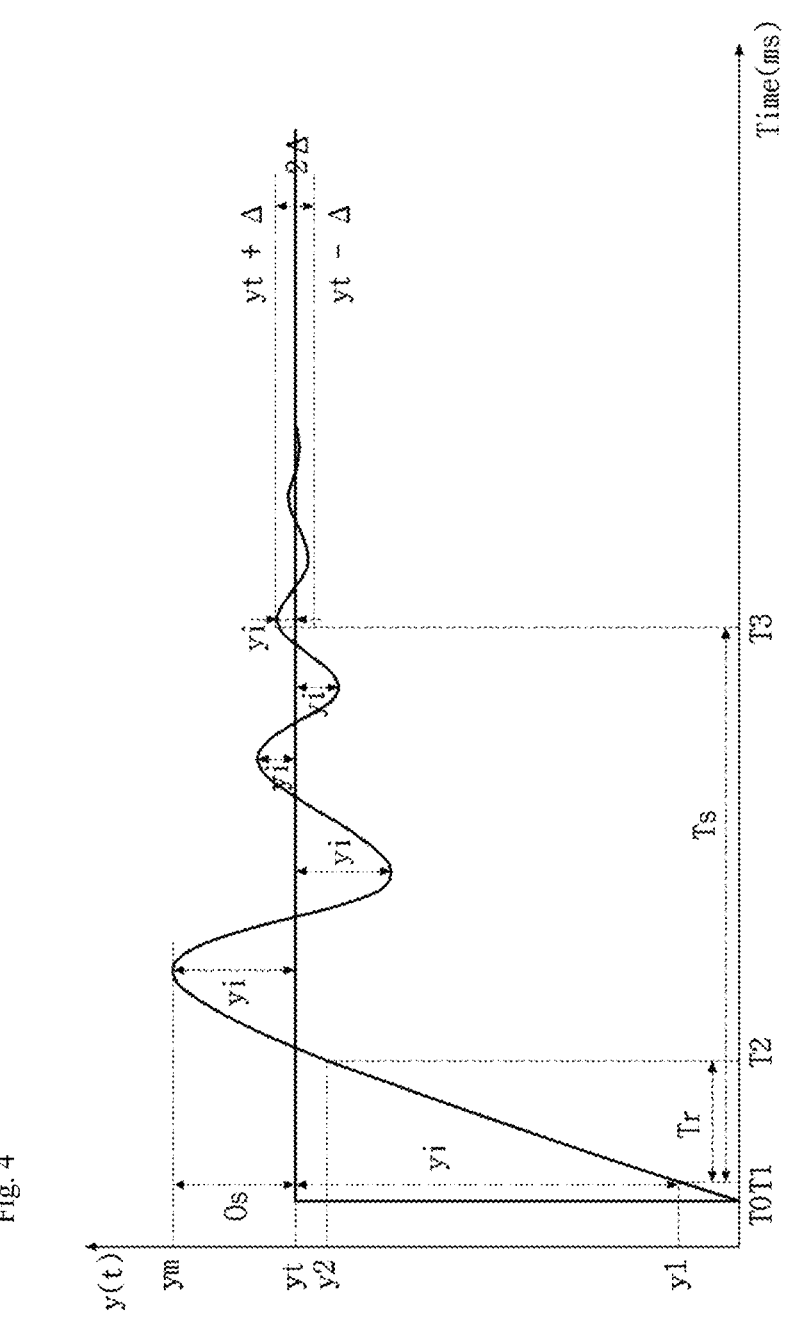
FIG. 4 is a graph illustrating an output signal of the camera module according to an embodiment.

FIG. 4 is a graph illustrating an output signal of the camera module according to an embodiment.

Referring to FIG. 4, the parameter generation unit 80 may measure a step response characteristic of the camera module 62 according to the step input signal r(t) by measuring the time taken for the output signal y(t) to converge on target amplitude yt. The step response characteristic includes a rising time Tr, normal state response time Ts, and overshooting Os of the output signal y(t).

The parameter generation unit 80 may measure, as the rising time Tr, the time during which amplitude of the output signal y(t) rises from first amplitude y1 to second amplitude y2. For example, the parameter generation unit 80 may measure the time taken for the output signal y(t) to rise from the first amplitude y1, that is, 10% of maximum amplitude ym, to the second amplitude y2, that is, 90% of the maximum amplitude ym, that is, between timing T1 and timing T2, as the rising time Tr.

The parameter generation unit 80 may measure, as the normal state response time Ts, the time taken for the amplitude of the output signal y(t) to converge on the target amplitude yt, and may measure, as the normal state response time Ts, timing at which a variance yi of the output signal y(t) converges on 2Δ. For example, the parameter generation unit 80 may measure, as the normal state response time Ts, a time between timing TO and timing T3 at which the variance yi of the output signal y(t) converges on 2A. The variance yi is a difference between the target amplitude yt and the amplitude of the output signal y(t).

The parameter generation unit 80 may calculate the overshooting Os corresponding to a difference between the maximum amplitude ym and the target amplitude yt. The parameter generation unit 80 may calculate the overshooting Os according to Equation 2 below.

$$\text{overshooting } Os(\%) = (ym\ ys)/ys \qquad \text{[Equation 2]}$$

The parameter generation unit 80 may represent the proportional parameter Kp, the integral parameter Ki, and the derivative parameter Kd as a bit string, and may then measure the step response characteristic by applying the genetic algorithm. The parameter generation unit 80 may calculate a fitness function based on the step response characteristic. The parameter generation unit 80 may calculate the fitness function corresponding to an i-th entity group by using the sum of squares of the variance yi.

Furthermore, the parameter generation unit 80 may calculate the fitness function according to Equation 3 below.

$$\text{Fitness function} = \sum_{i=1}^{k} (y_i)^2 \qquad \text{[Equation 3]}$$

Hereinafter, a method of the parameter generation unit 80 according to an embodiment obtaining optimal PID parameters by using the genetic algorithm is described with reference to FIG. 5.

Figure 5:
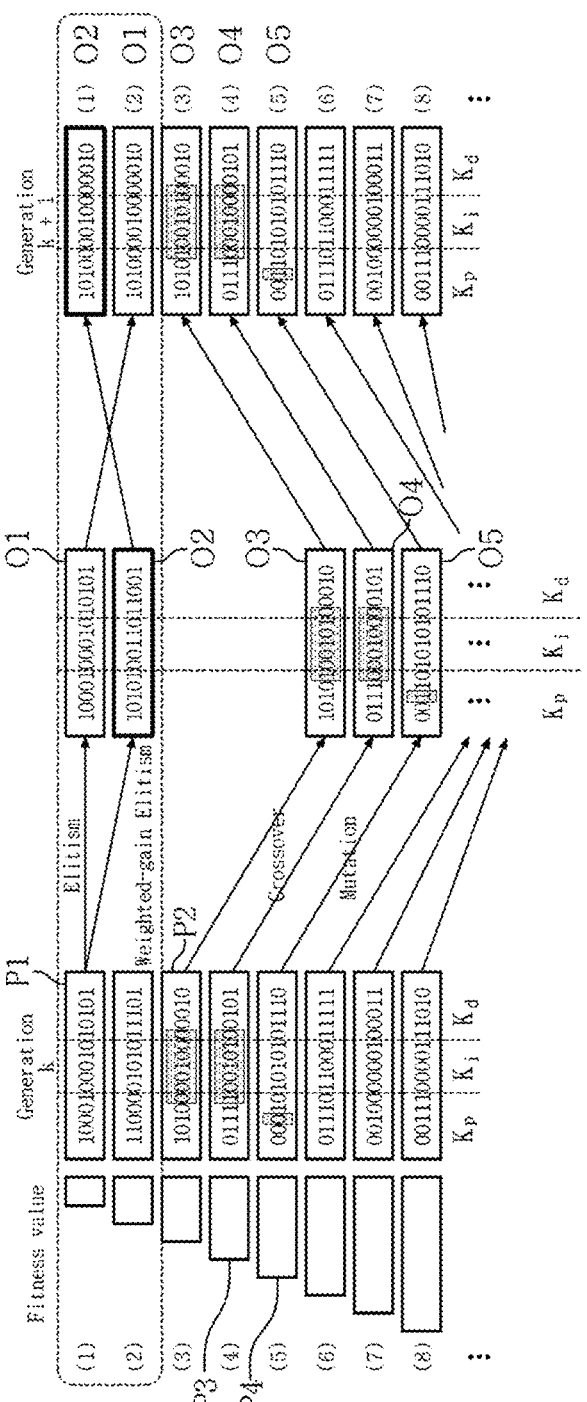
FIG. 5 is a diagram illustrating a method of obtaining PID parameters of a next generation by using a genetic algorithm according to an embodiment.

FIG. 5 is a diagram illustrating a method of obtaining PID parameters of a next generation by using the genetic algorithm according to an embodiment.

Referring to FIG. 5, the parameter generation unit 80 may represent, as a bit string, each of a plurality of parameter (Kp[i], Ki[i], and Kd[i]) entities corresponding to a current generation. The parameter generation unit 80 may arrange the plurality of parameter entities based on fitness values corresponding to the plurality of parameter entities, respectively. The parameter generation unit 80 arranges the plurality of parameter entities by setting priorities in ascending order of the fitness values. For example, the parameter generation unit 80 may set, as first priority, a parameter entity having the smallest fitness value among a plurality of PID parameter entities of a current generation (e.g., a k generation), may set, as eight priority, a parameter entity having the greatest fitness value among the plurality of PID parameter entities, and may arrange the entities of a plurality of proportional parameters Kp, integral parameters Ki, and derivative parameters Kd in order from the first priority to the eight priority.

Furthermore, the parameter generation unit 80 may generate a plurality of parameter entities corresponding to a next generation (e.g., a (k+1) generation) by applying the genetic algorithm to the plurality of PID parameters of the current generation k.

For example, the parameter generation unit 80 may select a PID parameter entity P1 having the smallest fitness value among the plurality of parameter entities of the current generation k. The parameter generation unit 80 may generate an offspring entity O1 by applying elitism to the parent parameter entity P1. The elitism is an operation of generating, as the offspring entity O1, the PID parameter entity P1 having the smallest fitness value without any change. That is, a proportional parameter Kp, integral parameter Ki, and derivative parameter Kd of the offspring entity O1 are the same as a proportional parameter Kp, integral parameter Ki, and derivative parameter Kd of the parent parameter entity P1.

Furthermore, the parameter generation unit 80 may generate an offspring entity O2 by applying weight-gain elitism to the parent parameter entity P1. The weight-gain elitism means an operation of the genetic algorithm for calculating a weight according to a step response characteristic with respect to the parent parameter entity P1 and adding the calculated weight to the parent parameter entity P1. That is, the parameter generation unit 80 may calculate the weight based on a step response characteristic with respect to the parent parameter entity P1. The parameter generation unit 80 may generate the offspring entity O2 by adding the weight to the parent parameter entity P1.

For example, the parameter generation unit 80 may calculate a proportional weight Weighted_P corresponding to a rising time error among step response characteristics according to Equation 4 below.

$$\text{Weighted\_P} = (Tr\ Trd)^* \eta \qquad \text{[Equation 4]}$$

In Equation 4, Tr is the rising time Tr described with reference to FIG. 4. Trd is a target rising time. $\eta$ is a learning rate and means a slope value for finding an optimal solution (i.e., global minima) as hyper parameters.

Furthermore, the parameter generation unit 80 may calculate the integral weight Weighted_I corresponding to a normal state response time error among step response characteristics according to Equation 5 below.

$$\text{Weighted\_I} = (Tsd\ Ts)^* \eta \qquad \text{[Equation 5]}$$

In Equation 5, Ts is the normal state response time Ts described with reference to FIG. 4. Tsd is a target normal state response time. $\eta$ is the learning rate.

Furthermore, the parameter generation unit 80 may calculate a derivative weight Weighted_D corresponding to an overshooting error among step response characteristics according to Equation 6 below.

$$\text{Weighted\_D} = (Os\ Osd)^* \eta \qquad \text{[Equation 6]}$$

In Equation 6, Os is the overshooting Os described with reference to FIG. 4. Osd is target overshooting. $\eta$ is the learning rate.

Furthermore, the parameter generation unit 80 may generate a weighted parameter by adding the weight to the parent parameter entity P1.

The parameter generation unit 80 may generate a weighted proportional parameter Kp_W by adding the proportional weight Weighted_P to the proportional parameter Kp of the parent parameter entity P1 according to Equation 7 below.

$$Kp\_W = Kp + \text{Weighted\_P} \qquad \text{[Equation 7]}$$

In Equation 7, Weighted_P is the proportional weight.

For example, the parameter generation unit 80 may generate "10101", that is, the weighted proportional parameter Kp_W, by calculating the proportional weight Weighted_P based on the rising time Tr, a target rising time Trd, and the learning rate n, and then adding the proportional weight Weighted_P to "10001", that is, a representation of the proportional parameter Kp of the parent parameter entity P1 as a bit string.

Furthermore, the parameter generation unit 80 may generate a weighted integral parameter Ki_W by adding the integral weight Weighted_I to the integral parameter Ki of the parent parameter entity P1 according to Equation 8 below.

$$Ki\_W = Ki + \text{Weighted\_I} \qquad \text{[Equation 8]}$$

In Equation 8, Weighted_I is the integral weight.

For example, the parameter generation unit 80 may generate "00110", that is, the weighted integral parameter Ki_W, by calculating the integral weight Weighted_I based on the normal state response time Ts, a target normal state response time Tsd, and the learning rate n, and then adding the integral weight Weighted_I to "00010", that is, a representation of the integral parameter Ki of the parent parameter entity P1 as a bit string.

Furthermore, the parameter generation unit 80 may generate a weighted derivative parameter Kd_W by adding the derivative weight Weighted_D to the derivative parameter Kd of the parent parameter entity P1 according to Equation 9 below.

$$Kd\_W = Kd + \text{Weighted\_D} \qquad \text{[Equation 9]}$$

In Equation 9, Weighted_D is the derivative weight.

For example, the parameter generation unit 80 may generate "11001", that is, the weighted derivative parameter Kd_W, by calculating the derivative weight Weighted_D based on the overshooting Os, target overshooting Osd, and the learning rate n and then adding the derivative weight Weighted_D to "10101", that is, a representation of the derivative parameter Kd of the parent parameter entity P1 as a bit string.

Accordingly, the parameter generation unit 80 may generate an offspring entity O2 including, as a gene, "101010011011001", that is, a representation of the weighted proportional parameter Kp_W, the weighted integral parameter Ki_W, and the weighted derivative parameter Kd_W as a bit string.

Furthermore, the parameter generation unit 80 may select two parent parameter entities. The parameter generation unit 80 may generate two child entities of the next generation k+1 by performing a crossover operation to the selected two parent parameter entities. For example, the parameter generation unit 80 may select a parent parameter entity P2 and a parent parameter entity P3 among a plurality of parameter entities. The parameter generation unit 80 may exchange a gene "0001000" of the parent parameter entity P2 with a gene "1001010" of the parent parameter entity P3 on the basis of two intersections. The parameter generation unit 80 may generate an offspring entity O3 including a gene "101010010100010", and an offspring entity O4 including a gene "011100010000101", by performing the crossover operation on the parent parameter entity P2 and the parent parameter entity P3.

Furthermore, the parameter generation unit 80 may select, as a parent parameter entity, a given entity among a plurality of parameter entities of the current generation k.

The parameter generation unit 80 may generate an offspring entity of the next generation k+1 by performing mutation on a given gene among genes included in the selected given entity. For example, the parameter generation unit 80 may generate an offspring entity O5 including a gene "00010 10101 01110" by causing 1 among genes of a parent parameter entity P4 of the current generation k to mutate into 0.

Referring to FIG. 5, it may be seen that if the plurality of child entities generated in the aforementioned manner is arranged in inverse proportion to fitness values, a fitness value of the offspring entity O2 generated by applying the weight-gain elitism is the smallest. Furthermore, it may be seen that a fitness value of the offspring entity O1 generated by applying elitism is the second smallest.

Accordingly, the apparatus 1 for controlling a camera module according to an embodiment may generate a plurality of PID child parameter entities of the next generation k+1, which has the smallest fitness value, by applying the weight-gain elitism to a plurality of parameter entities of the current generation k.

Hereinafter, fitness values of the apparatus for controlling a camera module according to an embodiment are described with reference to FIGS. 6 and 7.

Figure 6:
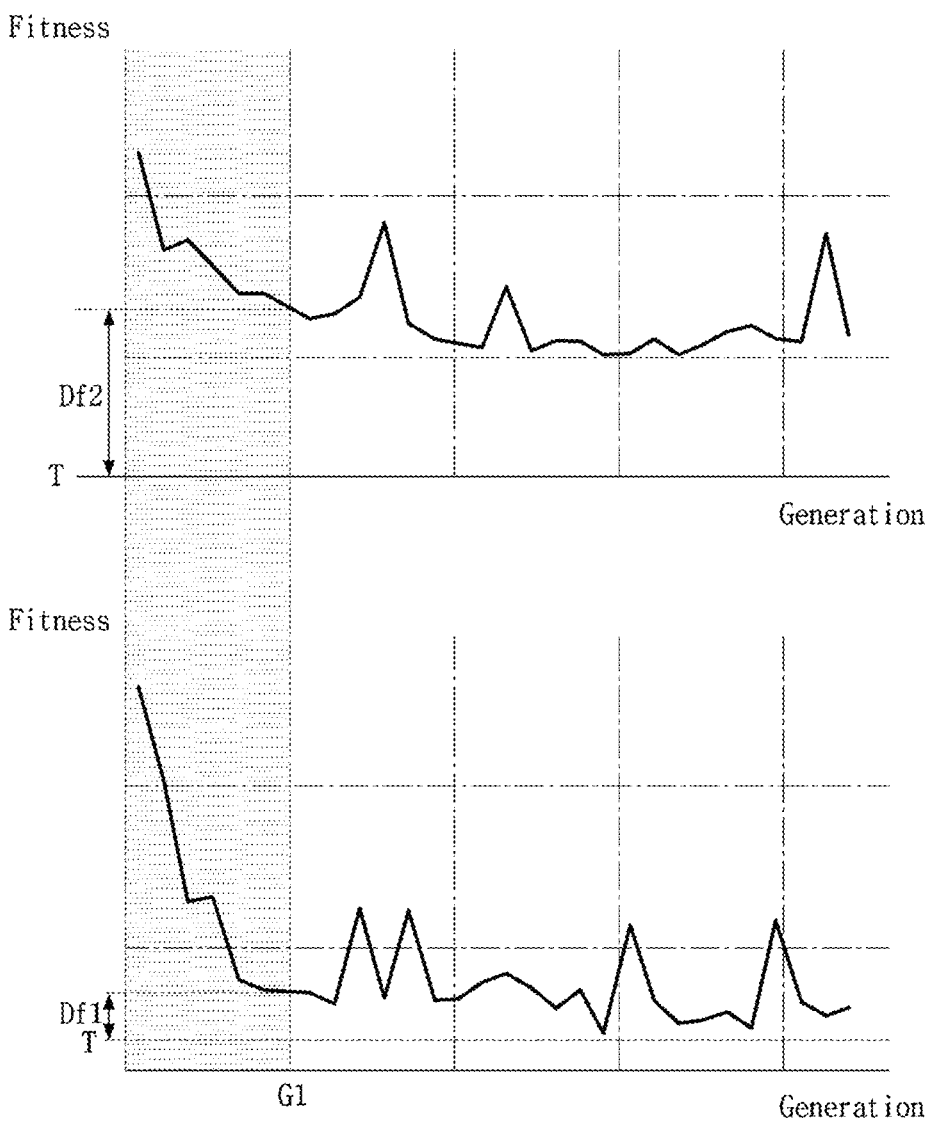
FIG. 6 is a graph illustrating fitness values according to generations in the apparatus for controlling a camera module according to an embodiment.

FIG. 6 is a graph illustrating fitness values according to generations in the apparatus for controlling a camera module according to an embodiment.

Figure 7:
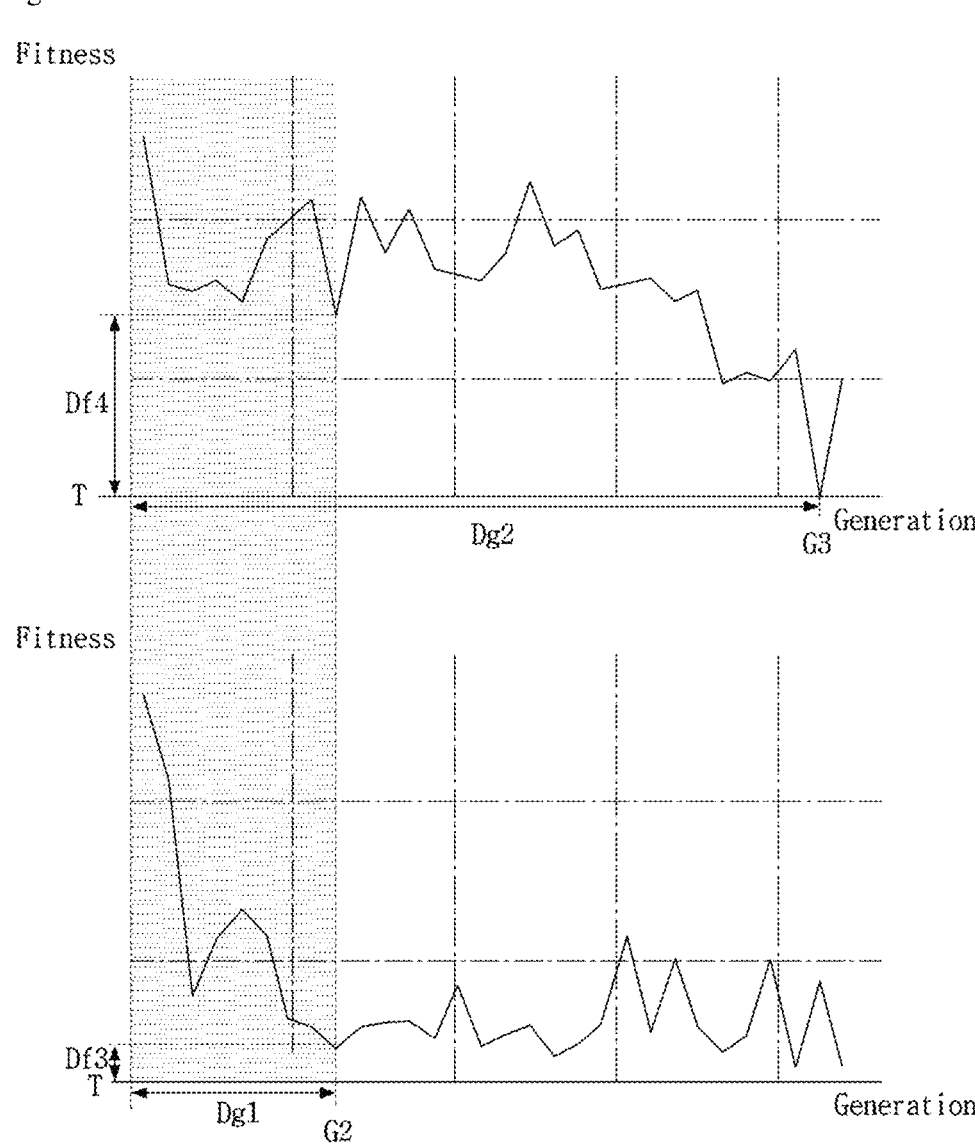
FIG. 7 is a graph illustrating fitness values according to generations in the apparatus for controlling a camera module according to an embodiment.

FIG. 7 is a graph illustrating fitness values according to generations in the apparatus for controlling a camera module according to an embodiment.

Referring to FIG. 6, an upper graph of FIG. 6 is a graph illustrating fitness values according to a generation when the weight-gain elitism is not applied. A lower graph of FIG. 6 is a graph illustrating fitness values according to a generation when the weight-gain elitism is applied.

The apparatus 1 applies the weight-gain elitism, so that in a generation G1, a fitness value approximately reaches a target fitness value T by an error Df1. However, when the weight-gain elitism is not applied, a fitness value does not reach the target fitness value T although the generation evolves over and over again. It may be seen that the error Df1 is very smaller than an error Df2 compared to fitness values corresponding to the same generation G1.

Accordingly, the apparatus 1 for controlling a camera module according to an embodiment has an effect in that it can rapidly generate a plurality of PID child parameter entities of the next generation k+1 by applying the weight-gain elitism to a plurality of parameter entities of the current generation k so that the target fitness value T having the smallest error is reached.

Referring to FIG. 7, an upper graph of FIG. 7 is a graph illustrating fitness values according to a generation when the weight-gain elitism is not applied. A lower graph of FIG. 7 is a graph illustrating fitness values according to a generation when the weight-gain elitism is applied.

The apparatus 1 applies the weight-gain elitism so that in a generation G2, a fitness value approximately reaches a target fitness value T by an error Df3. However, when the weight-gain elitism is not applied, the fitness value reaches the desired target fitness value T in a generation G3. It may be seen that the error Df3 is very smaller than an error Df4 compared to fitness values corresponding to the generation G2. Furthermore, it may be seen that the time taken to reach the target fitness value T is shorter in the generation G2 if the weight-gain elitism is applied than in the generation G3 if the weight-gain elitism is not applied.

Accordingly, the apparatus 1 for controlling a camera module according to an embodiment has an effect in that it can rapidly generate a plurality of PID child parameter entities of the next generation k+1 by applying the weight-gain elitism to a plurality of parameter entities of the current generation k so that the target fitness value T is rapidly reached.

Hereinafter, a method of controlling a camera module according to an embodiment is described with reference to FIG. 8.

Figure 8:
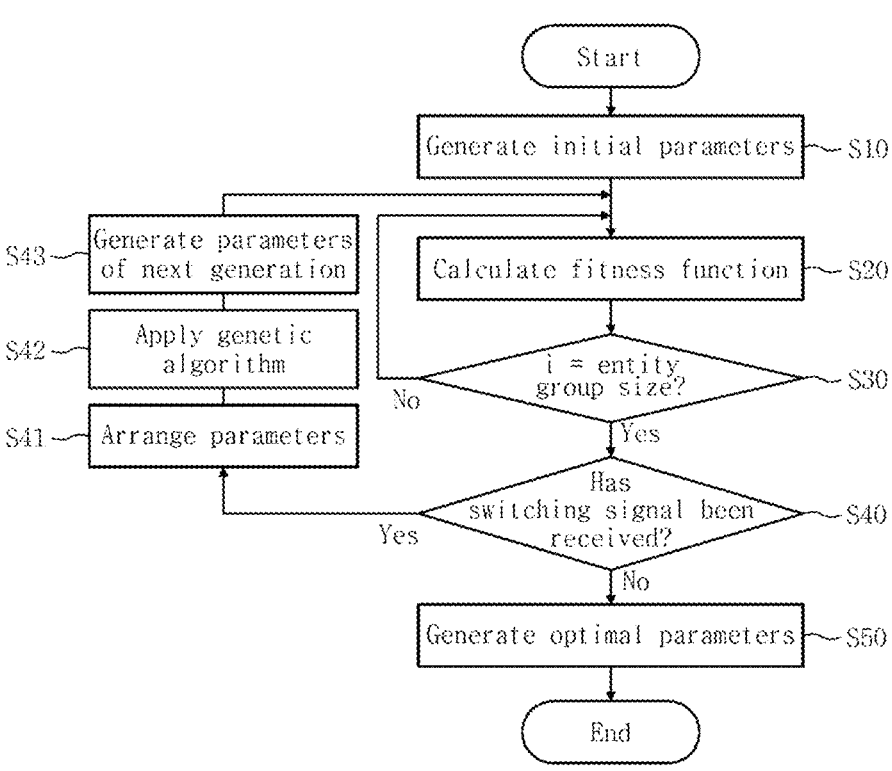
FIG. 8 is a flowchart illustrating a method of controlling a camera module according to an embodiment.

FIG. 8 is a flowchart illustrating a method of controlling a camera module according to an embodiment.

In step S10, the apparatus 1 for controlling a camera module generates an initial proportional parameter Kp[1], an initial integral parameter Ki[1], and an initial derivative parameter Kd[1].

In step S20, the apparatus 1 for controlling a camera module calculates a fitness function by using the initial proportional parameter Kp[1], the initial integral parameter Ki[1], and the initial derivative parameter Kd[1]. The apparatus 1 for controlling a camera module generates (i–1)-th parameters Kp[i–1], Ki[i–1], and Kd[i–1] of a current generation k. The apparatus 1 for controlling a camera module calculates fitness values of the (i–1)-th parameters Kp[i–1], Ki[i–1], and Kd[i–1]. The apparatus 1 for controlling a camera module generates parameters Kp[i], Ki[i], and Kd[i] of a next generation while increasing the value i for each unit. The apparatus 1 for controlling a camera module calculates a fitness value of the parameters Kp[i], Ki[i], and Kd[i].

In step S30, the apparatus 1 for controlling a camera module determines whether the value i is identical with an entity group size (or a population size).

In step S40, the apparatus 1 for controlling a camera module determines whether the switching signal Sw has been received when it is determined that the value i is identical with the entity group size.

In step S41, the apparatus 1 for controlling a camera module represents, as a bit string, each of a plurality of parameter (Kp[i], Ki[i], and Kd[i]) entities included in the current generation k when it is determined that the switching signal Sw has been received. The apparatus 1 for controlling a camera module calculates a fitness value corresponding to each of the plurality of parameter entities. The apparatus 1 for controlling a camera module arranges the plurality of parameter entities based on the fitness values. For example, the apparatus 1 for controlling a camera module arranges the plurality of parameter entities by setting priorities in ascending order of the fitness values. The apparatus 1 for controlling a camera module sets, as first priority, a parameter entity having the smallest fitness value among the plurality of parameter entities of the current generation k, sets, as eight priority, a parameter entity having the greatest fitness value among the plurality of parameter entities, and arranges the entities of the proportional parameters Kp, the integral parameters Ki, and the derivative parameters Kd in order from the first priority to the eight priority.

In step S42, the apparatus 1 for controlling a camera module generates an offspring entity by applying the genetic algorithm to each of the plurality of arranged parameter entities of the current generation k. For example, the apparatus 1 for controlling a camera module may select a parent parameter entity P1 having the smallest fitness value among the plurality of parameter entities of the current generation k. The parameter generation unit 80 generates an offspring entity O1 by applying elitism to the parent parameter entity P1. The apparatus 1 for controlling a camera module generates a parameter entity group by using the generated offspring entity O1.

Furthermore, the apparatus 1 for controlling a camera module generates an offspring entity O2 by applying the weight-gain elitism to the parent parameter entity P1. The apparatus 1 for controlling a camera module generates child entities O3 and O4 by performing the crossover operation on selected two parent parameter entities. For example, the apparatus 1 for controlling a camera module may select a parent parameter entity P2 and a parent parameter entity P3 among a plurality of parameter entities. The apparatus 1 for controlling a camera module may perform a crossover operation for exchanging some (e.g., 0001000) of genes of the parent parameter entity P2 with some (e.g., 1001010) of genes of the parent parameter entity P3 on the basis of two intersections. The parameter generation unit 80 generates the offspring entity O3 including a gene "101010010100010", and the offspring entity O4 including a gene "011100010000101", by performing the crossover operation on the parent parameter entity P2 and the parent parameter entity P3. The apparatus 1 for controlling a camera module generates a parameter entity group by using the generated offspring entity O2.

Furthermore, the apparatus 1 for controlling a camera module may select a given entity among a plurality of parameter entities of the current generation k. The parameter generation unit 80 may generate an offspring entity O5 by performing mutation on a given one of genes included in the selected given entity. For example, the apparatus 1 for controlling a camera module generates the offspring entity O5 including a gene "000101010101110" by causing 1 among genes of a parent parameter entity P4 to mutate into 0. The apparatus 1 for controlling a camera module generates a parameter entity group by using the generated offspring entity O5.

In step S43, the apparatus 1 for controlling a camera module generates a plurality of parameter entities corresponding to a next generation (e.g., a (k+1) generation) by using the generated child entities O1, O2, O3, O4, and O5.

In step S50, the apparatus 1 for controlling a camera module generates, as an optimal parameter, an entity group of a generation including a plurality of parameters Kp, Ki, and Kd when it is determined that the switching signal Sw has not been received.

Accordingly, the apparatus 1 for controlling a camera module according to an embodiment has an effect in that it can rapidly generate a plurality of PID child parameter entities of the next generation k+1 by applying the weight-gain elitism to a plurality of parameter entities of the current generation k so that a target fitness value T is rapidly reached.

Furthermore, the apparatus 1 for controlling a camera module according to an embodiment has an effect in that it can rapidly generate a plurality of PID child parameter entities of the next generation k+1 by applying the weight-gain elitism to a plurality of parameter entities of the current generation k so that a target fitness value T having the smallest error is reached.

A bit string of an entity has been described as having 5 bits for the sake of convenience of description, but an embodiment is not limited thereto. A bit string of an entity may have 5 bits or more.

Furthermore, the embodiments of the present disclosure have been described in detail, but the scope of a right of the embodiments is not limited thereto, and the scope of rights of the embodiments also includes a variety of modifications and changes of those skilled in the art using the basic concept of embodiments defined in the appended claims.

DESCRIPTION OF REFERENCE NUMERALS

1: apparatus for controlling camera module
10: gyro sensor
20: first filter
30: switch
40: error generator
50: controller
51: first control output generator
52: second control output generator
53: third control output generator
60: camera module unit
70: input unit
80: parameter generation unit

What is claimed is:

1. An apparatus for controlling a camera module, comprising:

a parameter generation unit configured to generate a parameter entity group, calculate a fitness value of the parameter entity group based on a step response characteristic of an output signal, and generate an offspring entity by applying weight-gain elitism to a parameter entity having a smallest fitness value among parameter entities included in the parameter entity group; and a controller configured to generate a control signal by multiplying an error signal by a parameter, wherein the error signal is a difference between the output signal and a reference signal, and the weight-gain elitism is a genetic algorithm operation of adding a weight according to the step response characteristic to a parameter having the smallest fitness value, wherein the parameter entity group is generated to include the parameter corresponding to the generated offspring entity, the step response characteristic comprises a rising time, the parameter comprises a proportional parameter, and the parameter generation unit additionally calculates a proportional weight based on a difference between the rising time and a target rising time and generates the proportional parameter of the offspring entity by adding the proportional weight to the proportional parameter.

2. The apparatus of claim 1, wherein:

the step response characteristic further comprises a normal state response time, the parameter further comprises an integral parameter, and the parameter generation unit additionally calculates an integral weight based on a difference between a target normal state response time and the normal state response time and generates the integral parameter of the offspring entity by adding the integral weight to the integral parameter.

3. The apparatus of claim 2, wherein:

the step response characteristic further comprises overshooting, the parameter further comprises a derivative parameter, and the parameter generation unit additionally calculates a derivative weight based on a difference between the overshooting and target overshooting and generates the derivative parameter of the offspring entity by adding the proportional weight to the proportional parameter.

4. The apparatus of claim 3, wherein the parameter generation unit additionally represents the proportional parameter as a bit string, then generates the proportional parameter of the offspring entity represented as a bit string by adding the proportional weight represented as a bit string.

5. The apparatus of claim 4, wherein the parameter generation unit additionally represents the integral parameter as a bit string, then generates the integral parameter of the offspring entity represented as a bit string by adding the integral weight represented as a bit string.

6. The apparatus of claim 5, wherein the parameter generation unit additionally represents the derivative parameter as a bit string, then generates the derivative parameter of the offspring entity represented as a bit string by adding the derivative weight represented as a bit string.

7. The apparatus of claim 1, wherein:

the parameter generation unit additionally generates an offspring entity by applying elitism to a parameter entity having a second smallest fitness value among the parameter entities included in the parameter entity group, and the offspring entity to which the elitism has been applied is identical with the parameter entity having the second smallest fitness value.

8. A method of controlling a camera module, comprising:

generating an output signal in response to a control signal;

generating an error signal corresponding to a difference between the output signal and a reference signal;

generating a parameter entity group;

calculating a fitness value of the parameter entity group based on a step response characteristic of the output signal;

generating an offspring entity by applying weight-gain elitism to a parameter entity having a smallest fitness value among parameter entities included in the parameter entity group; and generating the control signal by multiplying the error signal by a parameter, wherein the weight-gain elitism is a genetic algorithm operation of adding a weight according to the step response characteristic to a parameter having the smallest fitness value, wherein the generating of the parameter entity group comprises:

generating the parameter corresponding to the generated offspring entity; and generating the parameter entity group comprising the parameter, the step response characteristic comprises a rising time, the parameter comprises a proportional parameter, and the generating of the offspring entity comprises:

measuring the rising time of the output signal;

calculating a proportional weight based on a difference between the measured rising time and a target rising time; and generating the proportional parameter of the offspring entity by adding the proportional weight to the proportional parameter.

9. The method of claim 8, wherein:

the measuring of the rising time of the output signal comprises measuring a time between timing at which the output signal has first amplitude and timing at which the output signal has second amplitude, and the first amplitude is smaller than the second amplitude.

10. The method of claim 9, wherein:

the step response characteristic further comprises a normal state response time, the parameter further comprises an integral parameter, and the generating of the offspring entity comprises:

measuring the normal state response time;

calculating an integral weight based on a difference between a target normal state response time and the normal state response time; and generating the integral parameter of the offspring entity by adding the integral weight to the integral parameter.

11. The method of claim 10, wherein the measuring of the normal state response time comprises measuring, as the normal state response time, a time taken for amplitude of the output signal to converge on target amplitude.

12. The method of claim 11, wherein:

the step response characteristic further comprises overshooting, the parameter further comprises a derivative parameter, and the generating of the offspring entity comprises:

calculating the overshooting;

calculating a derivative weight based on a difference between the overshooting and target overshooting; and generating the derivative parameter of the offspring entity by adding the proportional weight to the proportional parameter.

13. The method of claim 12, wherein the calculating of the overshooting comprises calculating the overshooting based on a difference between maximum amplitude of the output signal and the target amplitude.

14. The method of claim 13, wherein the generating of the proportional parameter of the offspring entity further comprises:

representing the proportional parameter and the proportional weight as a bit string; and generating the proportional parameter of the offspring entity represented as a bit string by adding the proportional weight represented as a bit string, to the proportional parameter represented as a bit string.

15. The method of claim 14, wherein the generating of the integral parameter of the offspring entity further comprises:

representing the integral parameter and the integral weight as a bit string; and generating the integral parameter of the offspring entity represented as the bit string by adding the integral weight represented as a bit string to the integral parameter represented as a bit string.

16. The method of claim 15, wherein the generating of the derivative parameter of the offspring entity further comprises:

representing the derivative parameter and the derivative weight as a bit string; and generating the derivative parameter of the offspring entity represented as a bit string by adding the derivative weight represented as a bit string to the derivative parameter represented as a bit string; and generating the derivative parameter.

* * * * *